(12) United States Patent
Seidl

(10) Patent No.: US 7,195,973 B2
(45) Date of Patent: Mar. 27, 2007

(54) METHOD FOR FABRICATING A TRENCH CAPACITOR WITH AN INSULATION COLLAR AND CORRESPONDING TRENCH CAPACITOR

(75) Inventor: Harald Seidl, Pöring (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/205,323

(22) Filed: Aug. 17, 2005

(65) Prior Publication Data

US 2006/0084223 A1    Apr. 20, 2006

(30) Foreign Application Priority Data

Aug. 18, 2004    (DE) .................. 10 2004 040 046

(51) Int. Cl.
*H01L 21/8242*    (2006.01)
(52) U.S. Cl. .................. 438/243; 257/301; 257/304; 257/E27.093; 257/E21.653
(58) Field of Classification Search .................. 438/243; 257/301, 304, E27.093, E21.653
See application file for complete search history.

(56) References Cited

U.S. PATENT DOCUMENTS

| 5,942,799 | A  | * | 8/1999 | Danek et al. ................ 257/751 |
| 6,259,129 | B1 |   | 7/2001 | Gambino et al. |
| 6,548,850 | B1 | * | 4/2003 | Gernhard et al. ........... 257/301 |
| 6,828,192 | B2 | * | 12/2004 | Gustin et al. ................ 438/249 |
| 6,956,259 | B2 | * | 10/2005 | Akasaka ...................... 257/301 |
| 7,049,647 | B2 | * | 5/2006 | Karcher et al. ............. 257/301 |
| 2002/0158281 | A1 | * | 10/2002 | Goldbach et al. ........... 257/296 |
| 2002/0190298 | A1 | * | 12/2002 | Alsmeier et al. ........... 257/301 |
| 2004/0026727 | A1 |   | 2/2004 | Akasaka |

FOREIGN PATENT DOCUMENTS

| DE | 199 46 719 A1 | 4/2001 |
| DE | 101 28 718 A1 | 1/2003 |
| DE | 102 55 847 B3 | 7/2004 |

* cited by examiner

*Primary Examiner*—Trung Dang
(74) *Attorney, Agent, or Firm*—Morrison & Foerster LLP

(57) ABSTRACT

The present invention provides a method for fabricating a trench capacitor with an insulation collar in a substrate, which is electrically connected to the substrate on one side via a buried contact, in particular for a semiconductor memory cell with a planar selection transistor that is provided in the substrate and connected via the buried contact The invention likewise provides a corresponding trench capacitor.

11 Claims, 9 Drawing Sheets

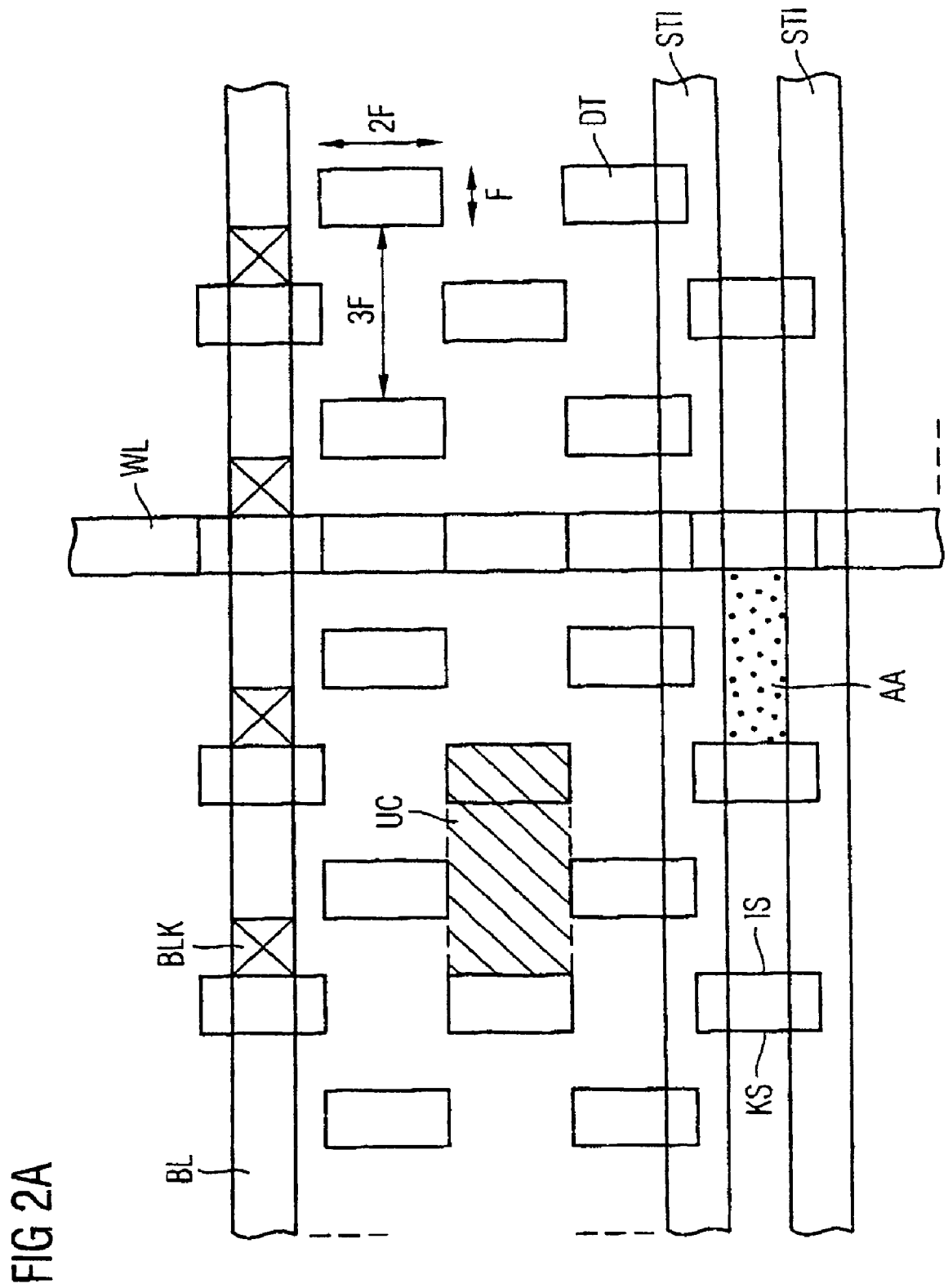

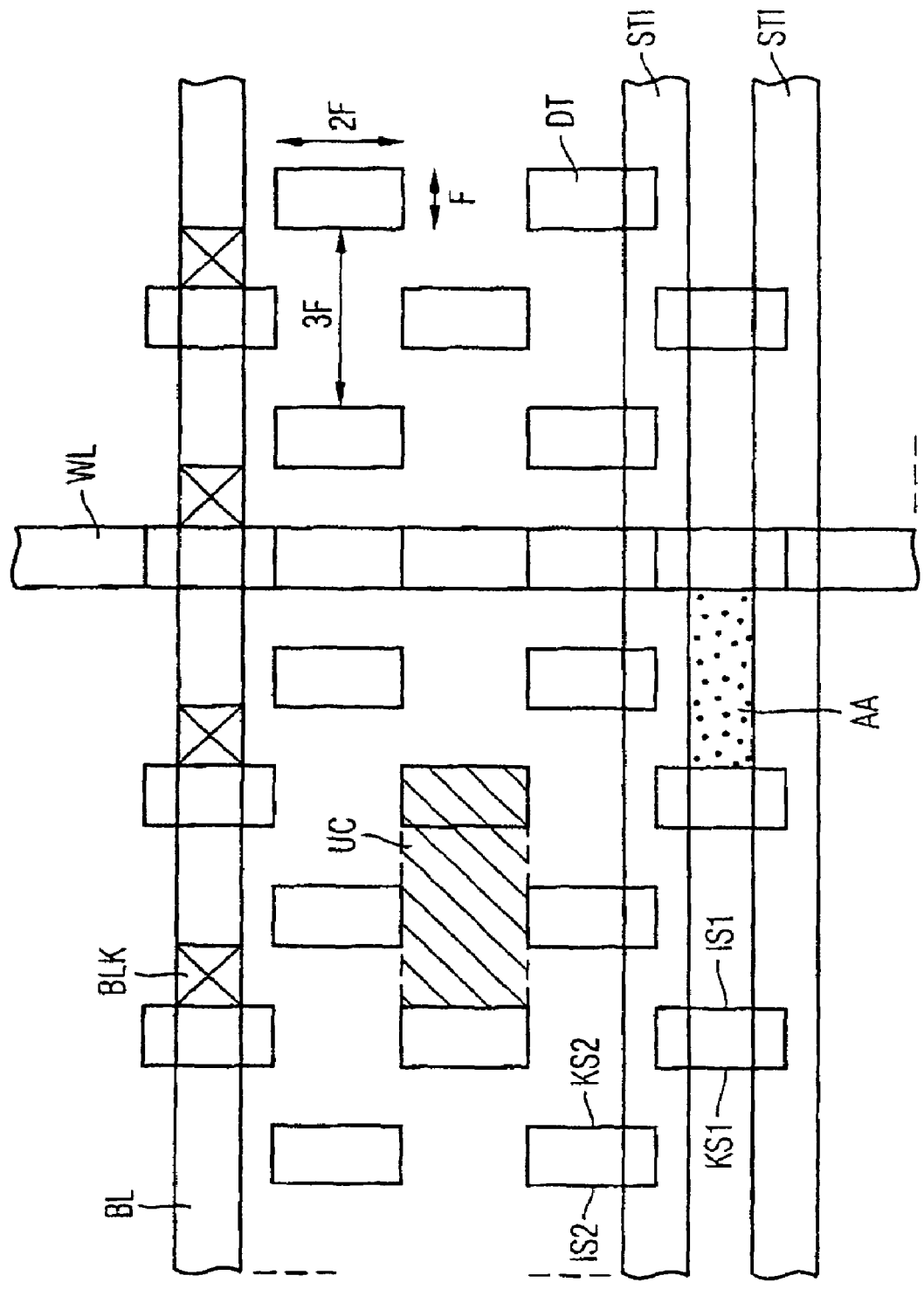

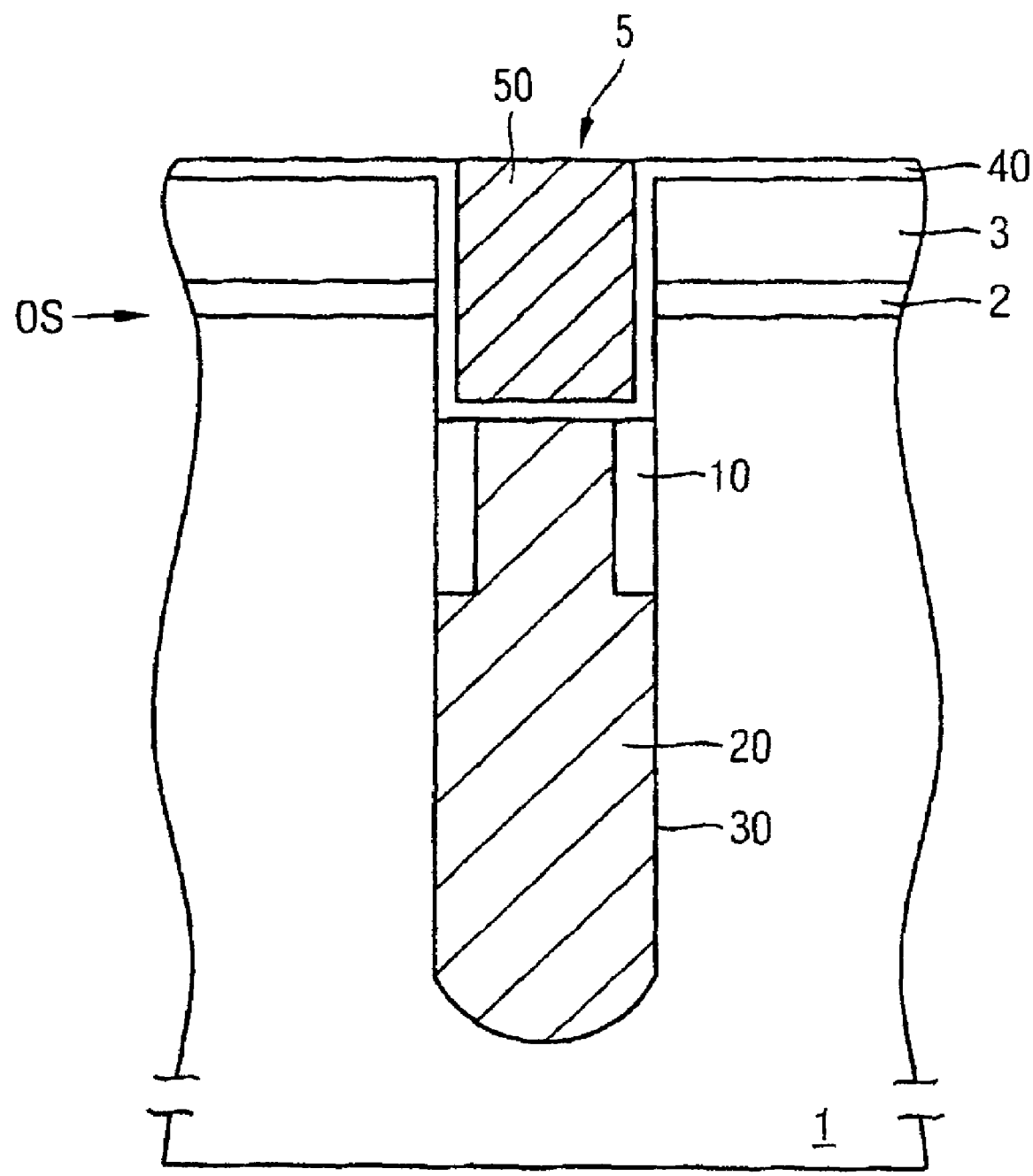

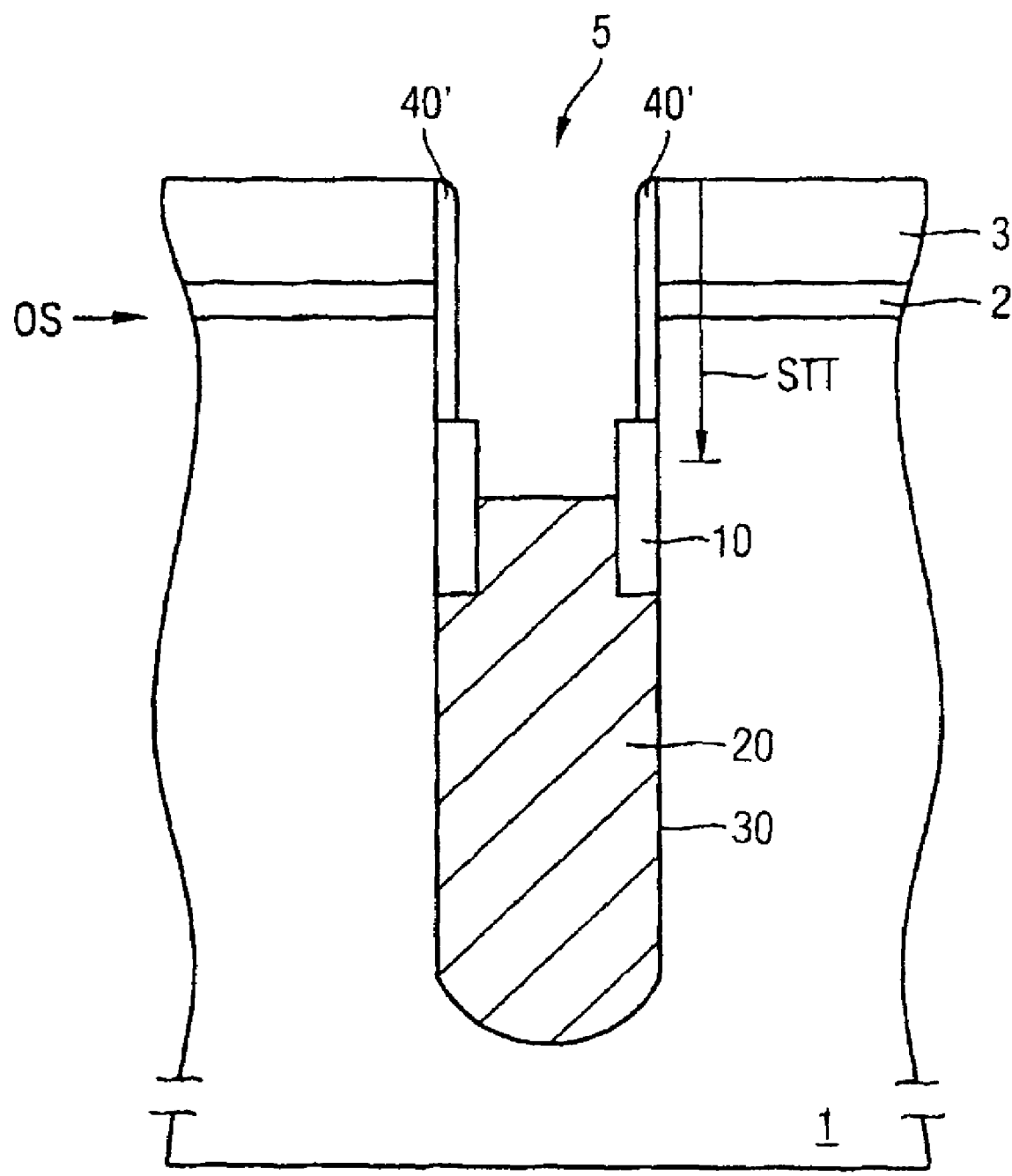

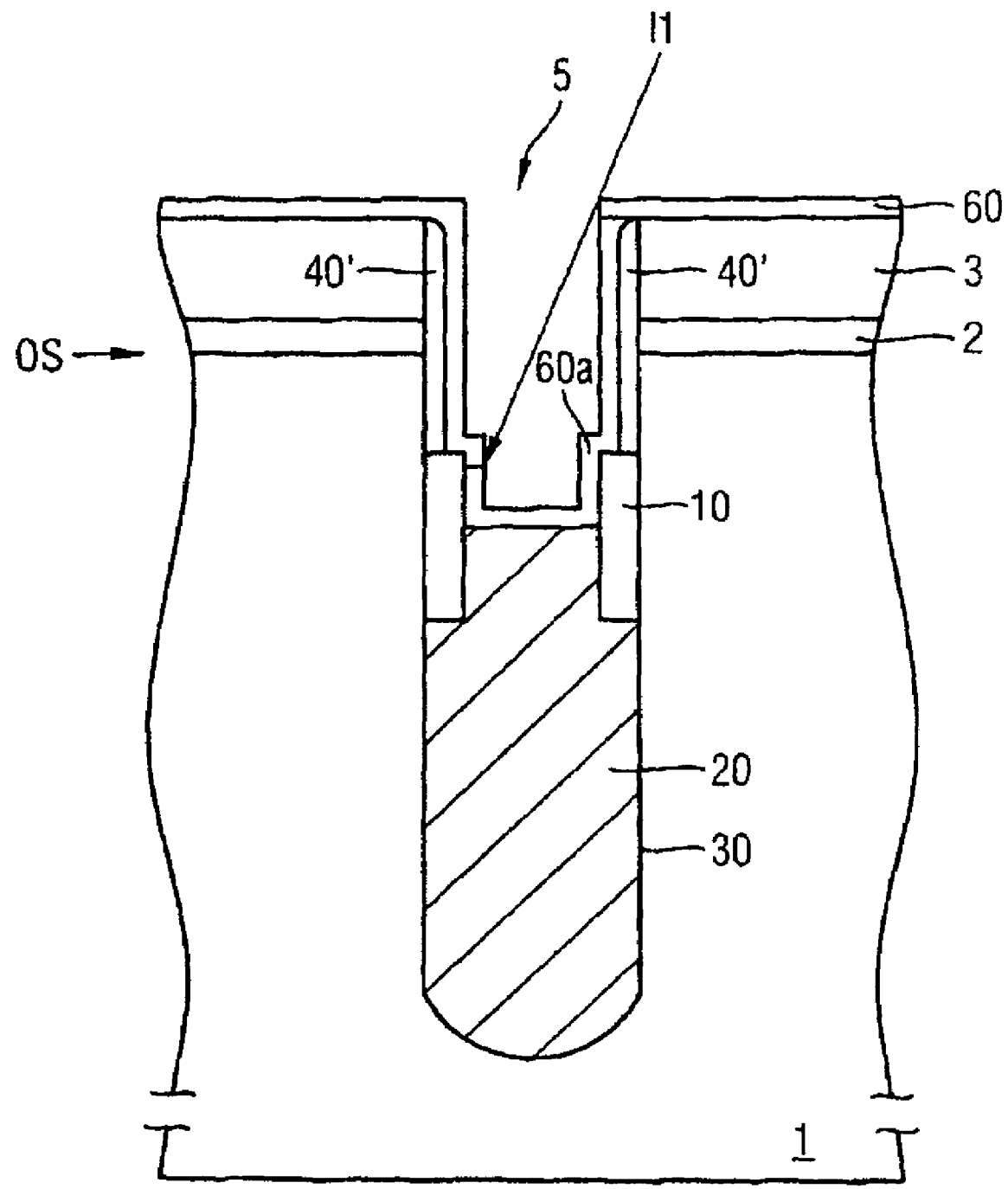

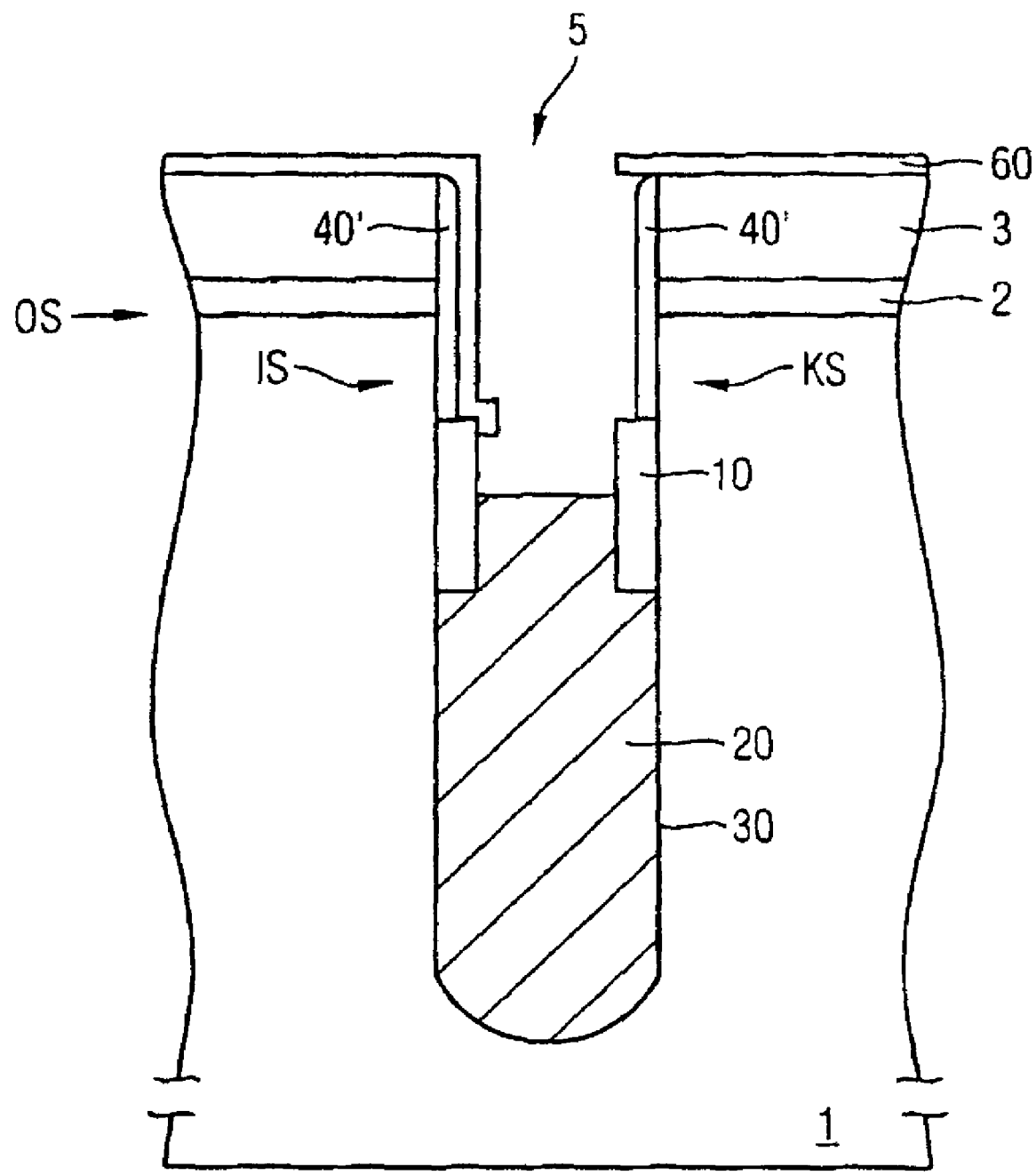

METHOD FOR FABRICATING A TRENCH CAPACITOR WITH AN INSULATION COLLAR AND CORRESPONDING TRENCH CAPACITOR

CLAIM FOR PRIORITY

This application claims the benefit of priority to German Application No. 10 2004 040 046.6, filed in the German language on Aug. 18, 2004, the contents of which are hereby incorporated by reference.

TECHNICAL FIELD OF THE INVENTION

The present invention provides a method for fabricating a trench capacitor with an insulation collar which is electrically connected to a substrate on one side via a buried contact, in particular for a semiconductor memory cell, and to a corresponding trench capacitor.

BACKGROUND OF THE INVENTION

Although applicable in principle to any desired integrated circuits, the present invention and the problem area on which it is based are explained with regard to integrated memory circuits in silicon technology.

FIG. 1 shows a diagrammatic sectional illustration of a semiconductor memory cell with a trench capacitor and a planar selection transistor connected thereto.

In FIG. 1, reference symbol 1 designates a silicon semiconductor substrate. Provided in the semiconductor substrate 1 are trench capacitors GK1, GK2 having trenches G1, G2, the electrically conductive fillings 20a, 20b of which form first capacitor electrodes. The conductive fillings 20a, 20b are insulated in the lower and central trench region by a dielectric 30a, 30b from the semiconductor substrate 1, which, for its part, forms the second capacitor electrodes (if appropriate in the form of a buried plate (not shown)).

Provided in the central and upper region of the trenches G1, G2 are peripheral insulation collars 10a, 10b, above which are provided buried contacts 15a, 15b, which are in electrical contact with the conductive fillings 20a, 20b and the adjoining semiconductor substrate 1. The buried contacts 15a, 15b are connected to the semiconductor substrate 1 only on one side (cf. FIGS. 2a, b). Insulation regions 16a, 16b insulate the other side of the substrate from the buried contacts 15a, 15b or insulate the buried contacts 15a, 15b toward the top side of the trenches G1, G2.

This enables a very high packing density of the trench capacitors GK1, GK2 and of the associated selection transistors, which will now be explained. In this case, reference is made principally to the selection transistor which is associated with the trench capacitor GK2, since only the drain region D1 or the source region S3, respectively, of adjacent selection transistors is depicted. The selection transistor associated with the trench capacitor GK2 has a source region S2, a channel region K2 and a drain region D2. The source region S2 is connected via a bit line contact BLK to a bit line (not shown) arranged above an insulation layer I. The drain region D2 is connected to the buried contact 15b on one side. A word line WL2 having a gate stack GS2 and a gate insulator G12 surrounding the latter runs above the channel region K2. The word line WL2 is an active word line for the selection transistor of the trench capacitor GK2.

Running parallel adjacent to the word line WL2 are word lines WL1 comprising gate stack GS1 and gate insulator GI1 and word line WL3 comprising gate stack GS3 and gate insulator GI3, which are passive word lines for the selection transistor of the trench capacitor GK2.

Said word lines WL1, WL3 serve for driving selection transistors which are displaced in the third dimension with respect to the sectional illustration shown.

FIG. 1 illustrates the fact that this type of connection on one side of the buried contact enables the trenches and the adjacent source regions or drain regions of relevant selection transistors to be arranged directly beside one another. As a result, the length of a memory cell may amount to just 4 F and the width to just 2 F, where F is the minimum length unit that can be realized technologically (cf. FIGS. 2a, b).

FIG. 2A shows a plan view of a memory cell array with memory cells in accordance with FIG. 1 in a first arrangement possibility.

Reference symbol DT in FIG. 2A designates trenches which are arranged row-wise at a distance of 3 F from one another and columnwise at a distance of 2 F. Adjacent rows are displaced by 2 F relative to one another. UC in FIG. 2A designates the area of a unit cell, which amounts to $4 F \times 2 F = 8 F^2$. STI designates isolation trenches which are arranged at a distance of 1 F from one another in the row direction and insulate adjacent active regions from one another. Bit lines BL likewise run at a distance of 1 F from one another in the row direction, whereas the word lines run at a distance of 1 F from one another in the column direction. In this arrangement example, all the trenches DT have a contact region KS of the buried contact to the substrate on the left-hand side and an insulation region IS on the right-hand side (regions 15a, b and 16a, b, respectively, in FIG. 1).

FIG. 2B shows a plan view of a memory cell array with memory cells in accordance with FIG. 1 in a second arrangement possibility.

In this second arrangement possibility, the rows of trenches have alternating connection regions and insulation regions of the buried contacts, respectively. Thus, in the bottommost row of FIG. 2B, the buried contacts are in each case provided with a contact region KS1 on the left-hand side and with an insulation region IS1 on the right-hand side. By contrast, in the row located above that, all the trenches DT are provided with each insulation region IS2 on the left-hand side and with a contact region KS2 on the right-hand side. This arrangement alternates in the column direction.

For DRAM memory devices with trench capacitors in sub-100 nm technologies, the resistance of the trench and of the buried contact are a main contribution to the total RC delay, and thus determine the speed of the DRAM. The relatively low conductivity and the pinch-off, which is produced by an overlay displacement of the STI etching, results in a dramatic increase in the series resistance in the trench.

This problem has been tackled by introducing polysilicon that is highly doped with arsenic, improving the overlay between the active regions and the trench, introducing self-aligned fabrication of a buried contact with a connection on one side and thinning the nitrided contact point of the buried contact. The SiN interface nevertheless significantly increases the series resistance since the charge carriers have to tunnel through the SiN interface.

SUMMARY OF THE INVENTION

The present invention discloses an improved method for fabricating a trench capacitor connected on one side and having a shorter RC delay.

The present invention provides a process in which the SiN interface can be dispensed with since a buried contact made of an amorphous conductive material is used.

In particular ternary or quaternary systems which remain amorphous even up to high temperatures are suitable for the buried contact according to the invention, thus e.g. TiAlN, TiSiN, TaSiN, HfSiN, TiTaN, TiHfN, TiZrN, TiZrSiN and the like.

In an advantageous manner, in the case of such a buried contact made of an amorphous conductive material, no dislocations can grow into the crystalline silicon substrate since no grain boundaries exist.

By varying the stoichiometry, it is possible to set a work function of 4.0 to 4.2 eV and thus avoid a Schottky barrier. The materials specified can be deposited very well by means of the ALD method, as a result of which it is possible to vary the composition by way of the layer thickness.

In accordance with one preferred embodiment, after the conductive amorphous metal filling has been etched back, an insulation cover is provided in the upper trench region at least as far as the top side of the substrate.

In accordance with a further preferred embodiment, the filling is provided as far as the top side of the insulation collar, then a nitride liner layer is deposited and then the trench is completely filled with the filling material, an STI trench fabrication process is effected and the filling material is removed.

In accordance with a further preferred embodiment, after removal of the filling material, spacers are formed on the trench walls above the insulation collar and the spacer lying above the connection region is removed, the spacer lying above the insulation region being masked with a silicon liner.

In accordance with a further preferred embodiment, the conductive amorphous metal filling is deposited by means of the ALD method (ALD=atomic layer deposition).

In accordance with a further preferred development, the conductive amorphous metal filling comprises one of the systems TiAlN, TiSiN, TaSiN, HfSiN, ZrSiN, TiTaN, TiHfN, TiZrN, TiZrSiN, TiHfSiN, TiZrAlN, TiHfAlN.

In accordance with a further preferred embodiment, the stoichiometric composition of the conductive amorphous metal filling is varied by way of its thickness.

In accordance with a further preferred embodiment, the stoichiometric composition is set in such a way that it amounts to 4.0 to 4.2 eV at the interface with the substrate.

BRIEF DESCRIPTION OF THE DRAWINGS

Exemplary embodiments of the invention are illustrated in the drawings and explained in more detail in the description below.

In the figures:

FIGS. 2A, B show a respective plan view of a memory cell array with memory cells in accordance with FIG. 1 in a first and second arrangement possibility.

FIGS. 3A–F show method stages of a fabrication method as an embodiment of the present invention.

In the figures, identical reference symbols designate identical or functionally identical constituent parts.

DETAILED DESCRIPTION OF THE INVENTION

In the embodiments described below, for reasons of clarity, a portrayal of the fabrication of the planar selection transistors is dispensed with and only the formation of the buried contact of the trench capacitor, which buried contact is connected on one side, is discussed in detail. Unless expressly mentioned otherwise, the steps of fabricating the planar selection transistors are the same as in the prior art.

FIGS. 3A–F are diagrammatic illustrations of successive method stages of a fabrication method as first embodiment of the present invention.

Figure 1:
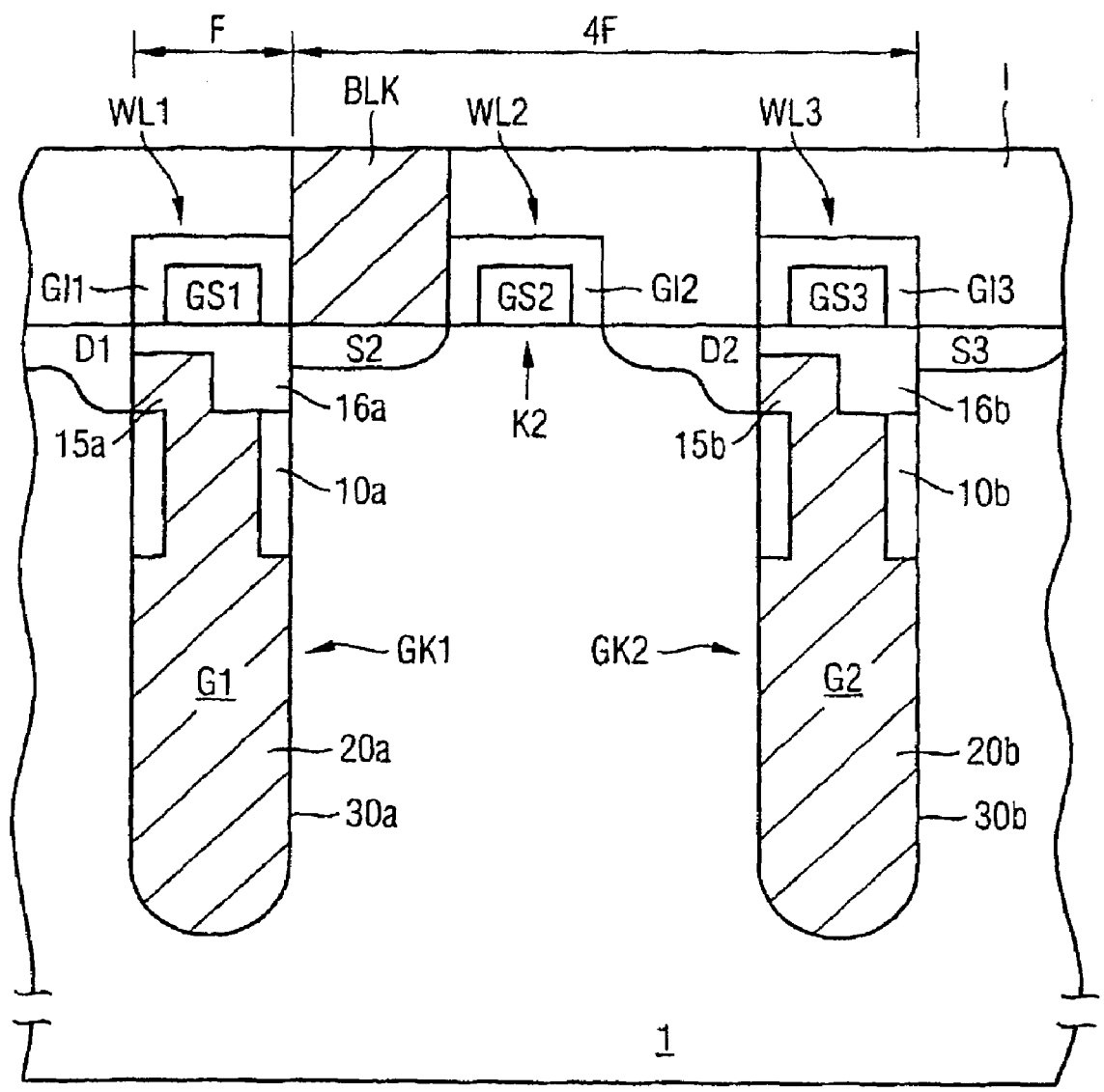
FIG. 1 shows a semiconductor memory cell with a trench capacitor and a planar selection transistor connected thereto.
Figure 3A:
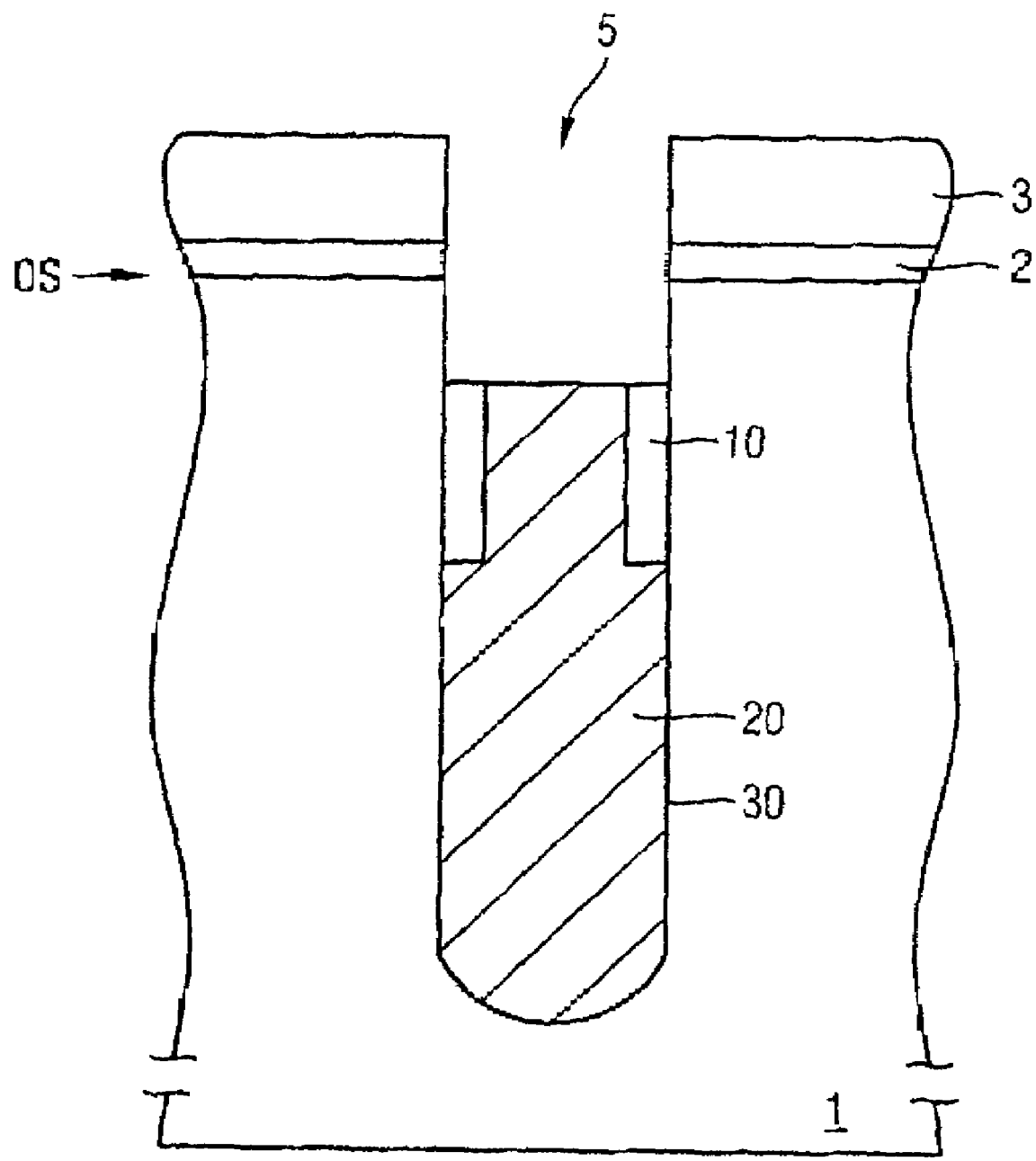

In FIG. 3A, reference symbol 5 designates a trench provided in the silicon semiconductor substrate 1. Provided on the top side OS of the semiconductor substrate 1 is a hard mask comprising a pad oxide layer 2 and a pad nitride layer 3. A dielectric 30 is provided in the lower and central region of the trench 5, said dielectric insulating an electrically conductive filling 20 from the surrounding semiconductor substrate 1. A peripheral insulation collar 10 is provided in the upper and central region of the trench 5, said insulation collar being sunk into the trench 5 to approximately the same level as the conductive filling 20. An exemplary material for the insulation collar 10 is silicon oxide, and polysilicon for the electrically conductive filling 20. However, other material combinations are also conceivable, of course.

In accordance with FIG. 3B, firstly a liner layer 40 is deposited above the structure in accordance with FIG. 3A, which comprises silicon nitride or silicon nitride/silicon oxide, e.g. thermal $SiO_2$ and LPCVD-$Si_3N_4$.

The trench 5 is thereupon closed again with a polysilicon filling 50, for example by deposition and subsequent chemical mechanical polishing.

In a subsequent process step, not illustrated in the figures, a hard mask is then formed above the structure in accordance with STI trenches to be formed which lie in parallel planes in front of and behind the plane of the drawing, whereupon the STI trenches are etched and filled (high-temperature process). Afterward, the hard mask for the STI trench formation is removed again.

The purpose of this advanced high-temperature step is to prevent the high-temperature step from having any further influence later on the buried contact that is then to be formed.

Furthermore, with reference to FIG. 3C, in which STT designates the STI trench depth, the polysilicon filling 50 is then removed by means of a wet etching, and the liner layer 40 is subjected to an anisotropic spacer etching in order to form spacers 40'. As can be seen from FIG. 3C, during the etching back of the polysilicon filling, the trench polysilicon filling 20 is also etched back to below the top side of the insulation collar 10, so that the STI trench depth STT lies between the top side of the insulation collar 10 and the top side of the trench polysilicon filling 20.

With reference to FIG. 3D, an amorphous silicon liner 60 is subsequently deposited conformally over the resulting structure, into which boron ions are implanted by means of an oblique implantation I1, reference symbol 60a designating a region shaded from the implantation. The region 60a of the silicon liner 60 which is shaded from the implantation has a higher etching rate with regard to an $NH_4OH$ etching carried out as the next process step.

With reference to FIG. 3E, an $NH_4OH$ etching has the effect that the region 60a can be removed selectively with respect to the remaining, implanted region of the silicon liner 60.

In a subsequent process step, the uncovered region of the nitride spacer 40' which is situated on the right-hand side of the figure is selectively etched by means of $H_3PO_4$ in order to uncover the later contact region KS of the buried contact.

Figure 3F:
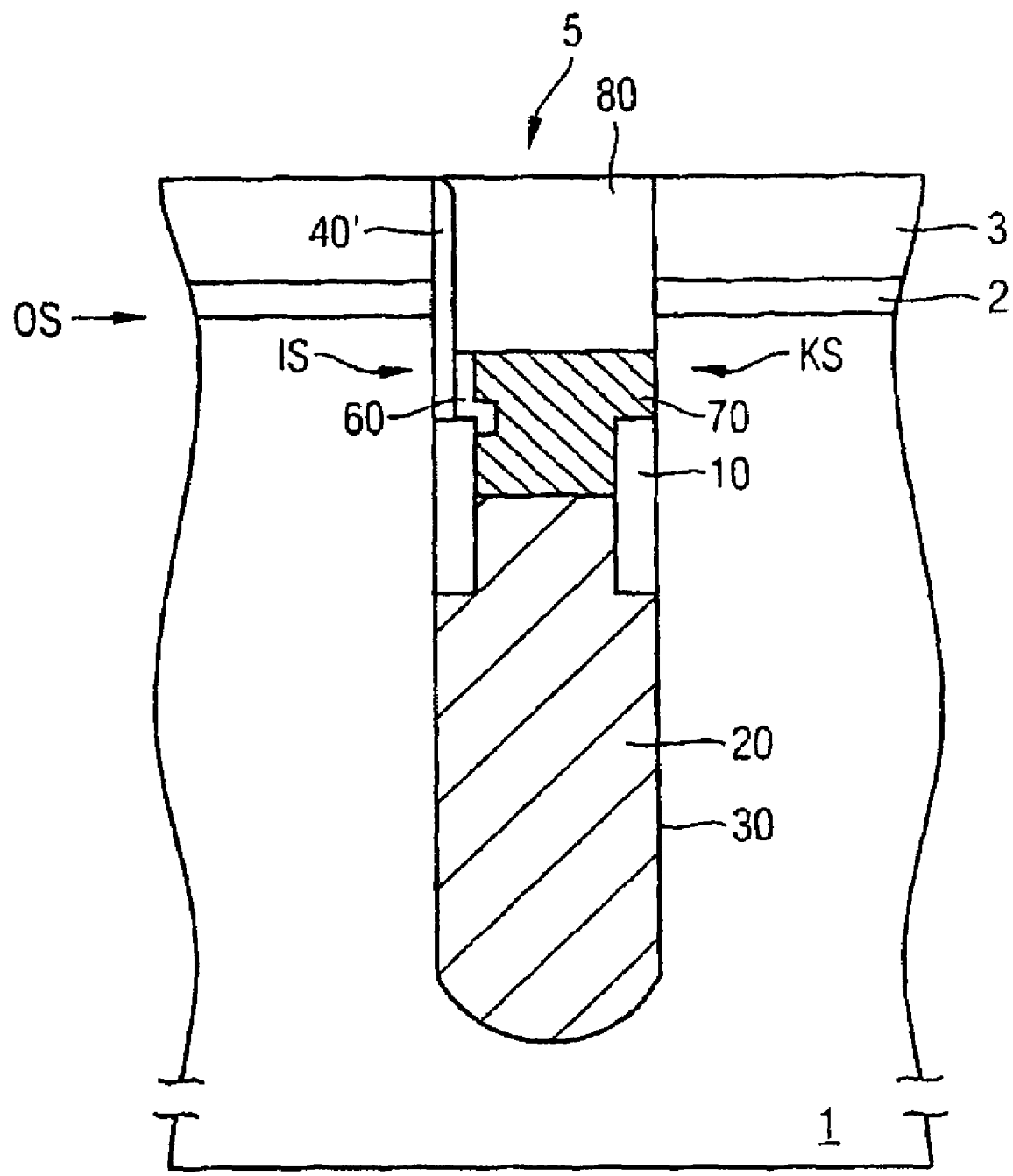

With reference to FIG. 3F, a metal deposition of e.g. TiTaN without prior SiN interface formation is then effected directly onto the crystalline silicon substrate 1 in order to form a conductive amorphous filling 70 in the contact region KS.

At the beginning of the deposition, a Ta-rich layer is deposited in order to set the work function to 4.0 to 4.2 eV. In the course of the deposition, the Ti proportion in the layer is gradually increased in order to reduce the electrical resistance.

Afterward, the conductive amorphous filling 70 is etched back to below the top side OS of the substrate 1 but to above the uncovered region of the insulation collar 10.

Finally, the trench 5 is filled with an insulation cover 80 in a known manner, said insulation cover comprising silicon oxide, for example.

Although the present invention has been described above on the basis of a preferred exemplary embodiment, it is not restricted thereto, but rather can be modified in diverse ways.

In particular, the selection of the layer materials is only by way of example and can be varied in many different ways.

What is claimed is:

1. A method for fabricating a trench capacitor with an insulation collar in a substrate, which is electrically connected to the substrate on one side via a buried contact, comprising:
    providing a trench in the substrate using a hard mask with a corresponding mask opening;
    providing a capacitor dielectric in the lower and central trench region, the insulation collar in the central and upper trench region and an electrically conductive filling at least as far as a top side of the insulation collar, the top side of the insulation collar being spaced apart from the top side of the substrate;
    sinking the electrically conductive filling to below the top side of the insulation collar;
    forming an insulation region on one side with respect to the substrate above the insulation collar;
    forming a connection region on a different side with respect to the substrate above the insulation collar; and
    forming the buried contact by depositing and etching back a conductive amorphous metal filling.

2. The method according to claim 1, wherein, after the conductive amorphous metal filling) has been etched back, an insulation cover is provided in the upper trench region at least as far as the top side of the substrate.

3. The method according to claim 1, wherein the filling is provided as far as the top side of the insulation collar, a nitride liner layer is deposited and the trench is completely filled with a filling material, an STI trench fabrication process is effected and the filling material is removed.

4. The method according to claim 3, wherein, after removal of the filling material), spacers are formed on the trench walls above the insulation collar and the spacer lying above the connection region is removed, the spacer lying above the insulation region being masked with a silicon liner.

5. The method according to claim 1, wherein the conductive amorphous metal filling is deposited by means of the ALD method.

6. The method according to claim 1, wherein the conductive amorphous metal filling comprises one of the systems TiAlN, TiSiN, TaSiN, HfSiN, ZrSiN, TiTaN, TiHfN, TiZrN, TiZrSiN, TiHfSiN, TiZrAlN, TiHfAlN.

7. The method according to claim 6, wherein the stoichiometric composition of the conductive amorphous metal filling is varied by way of its thickness.

8. The method according to claim 6, wherein the stoichiometric composition is set such that it amounts to 4.0 to 4.2 eV at the interface with the substrate.

9. A trench capacitor with an insulation collar in a substrate, which is electrically connected to the substrate on one side via a buried contact, comprising:
    a trench in the substrate;
    a capacitor dielectric in a lower and central trench region, the insulation collar in a central and upper trench region and an electrically conductive filling at least as far as the top side of the insulation collar, the top side of the insulation collar being spaced apart from the top side of the substrate;
    an insulation region on one side with respect to the substrate above the insulation collar;
    a connection region) on a different side with respect to the substrate above the insulation collar; and
    the buried contact as a conductive amorphous metal filling, wherein the conductive amorphous metal filling comprises one of the systems TiAlN, TiSiN, TaSiN, HfSiN, ZrSiN, TiTaN, TiHfN, TiZrN, TiZrSiN, TiHfSiN, TiZrAlN, TiHfAlN.

10. A trench capacitor with an insulation collar in a substrate, which is electrically connected to the substrate on one side via a buried contact, comprising:
    a trench in the substrate;
    a capacitor dielectric in a lower and central trench region, the insulation collar in a central and upper trench region and an electrically conductive filling at least as far as the top side of the insulation collar, the top side of the insulation collar being spaced apart from the top side of the substrate;
    an insulation region on one side with respect to the substrate above the insulation collar;
    a connection region) on a different side with respect to the substrate above the insulation collar; and
    the buried contact as a conductive amorphous metal filling, wherein the stoichiometric composition of the conductive amorphous metal filling is varied by way of its thickness.

11. The method according to claim 10, wherein the stoichiometric composition is set such that it amounts to 4.0 to 4.2 eV at the interface with the substrate.

* * * * *